United States Patent
Malarsie

(10) Patent No.: US 6,172,528 B1
(45) Date of Patent: *Jan. 9, 2001

(54) CHARGE SHARING CIRCUIT FOR FANOUT BUFFER

(75) Inventor: Louis J. Malarsie, Steep Falls, ME (US)

(73) Assignee: Fairchild Semiconductor Corporation, South Portland, ME (US)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/234,267

(22) Filed: Jan. 20, 1999

(51) Int. Cl.[7] .............................................. H03K 19/0175
(52) U.S. Cl. ................................ 326/86; 326/86; 326/87; 326/88; 326/82; 326/90; 326/92
(58) Field of Search .................................. 326/86, 87, 88, 326/82, 90, 92

(56) References Cited

U.S. PATENT DOCUMENTS

| | | | |
|---|---|---|---|
| 4,393,315 | 7/1983 | Stickel et al. | 307/264 |
| 4,625,127 | 11/1986 | Lee et al. | 307/270 |
| 5,010,260 | 4/1991 | Norwood et al. | 307/482.1 |
| 5,122,693 | 6/1992 | Honda et al. | 307/480 |
| 5,124,578 | 6/1992 | Worley et al. | 307/443 |
| 5,162,672 | 11/1992 | McMahan et al. | 307/443 |
| 5,204,558 | 4/1993 | Kumaki et al. | 307/475 |
| 5,258,660 | 11/1993 | Nelson et al. . | |
| 5,294,837 | 3/1994 | Takase et al. . | |
| 5,343,096 | 8/1994 | Heikes et al. | 307/480 |
| 5,430,398 | 7/1995 | Cooper et al. | 326/110 |
| 5,457,407 | 10/1995 | Shu et al. | 326/30 |
| 5,481,209 | 1/1996 | Lim et al. | 326/93 |
| 5,557,235 | 9/1996 | Koike | 327/564 |
| 5,600,261 * | 2/1997 | White et al. | 326/27 |
| 5,661,427 * | 8/1997 | McBride et al. | 327/236 |
| 5,719,862 * | 2/1998 | Lee et al. | 370/355 |
| 5,838,177 | 11/1998 | Keeth | 327/108 |
| 5,841,296 | 11/1998 | Churcher et al. | 326/49 |
| 5,892,685 | 4/1999 | Sugiyama et al. . | |
| 5,986,489 * | 11/1999 | Raza et al. | 327/170 |

FOREIGN PATENT DOCUMENTS

0451079A2   10/1991   (EP) .

* cited by examiner

Primary Examiner—Michael Tokar
Assistant Examiner—Vibol Tan
(74) Attorney, Agent, or Firm—Pierce Atwood; Chris A. Caseiro

(57) ABSTRACT

A deskew circuit for synchronizing output signals from a fanout buffer. The circuit includes one capacitive element coupled to each of the buffer's output nodes. Each capacitive element is also coupled to a common floating bus. The capacitive element is preferably a capacitor and the common floating bus is electrically isolated from any power rails. The bus may be formed of polysilicon or metal.

15 Claims, 4 Drawing Sheets

CHARGE SHARING CIRCUIT FOR FANOUT BUFFER

BACKGROUND OF THE INVENTION

1. Field of the Invention

The present invention relates to fanout buffers. More particularly, the present invention relates to fanout buffers designed to provide multiple synchronized outputs. Still more particularly, the present invention is a charge sharing circuit coupleable to a fanout buffer so as to ensure output synchronization.

2. Description of the Prior Art

Electronic circuit buffers are used to isolate load circuitry from affecting the operation of circuitry designed to control the load circuitry. That is, they provide an interface between a driving circuit and the circuitry being driven. The buffer is designed to ensure that signals are delivered from driving circuitry to one or more loads when required. Fanout buffers in particular are designed to isolate multiple output circuits from one or more input circuits. In most instances, fanout buffers are used to transfer a single logic (digital) signal from a logic circuit to a plurality of output loads coupled in parallel.

It can be seen that there are many possibilities for the application of fanout buffers. One sort of fanout buffer commonly used in computing systems is the clock buffer. A fanout clock buffer supplies a single timing signal to a plurality of load circuits. A clock timing signal is delivered to the fanout buffer which in turn supplies that timing signal to any number of loads, including, but not limited to, registers, memory, downstream circuit interfaces, and external peripherals. Ideally, in high-speed data transmission systems in particular, the buffer is designed such that all of the fanned out signals leave the clock driver synchronized, whether or not downstream intentional skewing is imparted to particular signals. Signal synchronization from the fanout buffer ensures that multiple computing tasks are properly coordinated. In high speed systems it also ensures that data transmission rates are properly coordinated for signal recognition purposes.

Unfortunately, in reality, fabrication vagaries, and temperature and load differences, among other reasons, cause uneven fanout signal skewing. That is, the signal transmitted from the buffer may be received more quickly by one load than another. Variations in signal transmission rates can cause significant task coordination problems, as well as data loss, both occurrences that are preferably avoided. It is therefore of value to provide a fanout buffer that can ensure signal synchronization.

Attempts at resolving this problem have met with some success. One solution involves tying together all of the output nodes of the fanout buffer such that the vagaries associated with one node are shared by all. However, such hardwiring can create adverse conditions in that all nodes will share a disruption applied to one node. In particular, a direct current path for all buffer outputs can be developed such as when one node is subject to a DC short. In that case, one short has the potential to overload all of the output nodes tied to that shorted node. This can occur, for example, in a backplane interface when a circuit board is inserted into a powered-up system and a short is generated by that live insertion. All boards coupled to that interface, which are in turn coupled to a fanout buffer, will experience the short. Given the potential hazard associated with a DC pathway, the simple tying together of fanout buffer circuits is an inadequate solution to skewing problems.

Other solutions that have been considered include the skew-minimizing circuit disclosed by Lim et al. in U.S. Pat. No. 5,481,209. Lim describes the application of tributary whiskers to distribute output loading. Some capacitive coupling is provided; however, the focus is on use of a tributary system that is organized to distribute signals to loads at various distances from an originating ring. The apparent goal of the Lim circuit is to equalize the distance between various loads and clock interfaces. Capacitive regulation may or may not be used to tune specific tributaries. The Lim circuit does not address fabrication and temperature vagary problems. It is to be noted that the capacitive effect of the whiskers is of concern in relatively fast switching (edge rates) systems, such as the fast switching fanout buffer that is the focus of the present invention. Circuitry with slower edge rates may not be concerned with the capacitive effects of these whiskers. The Lim circuitry must be tailored for every unique loading configuration in order to develop uniform edge rates. That may require changes in circuit timing and/or layout modifications. It thus lends itself to increased susceptibility to timing problems. In any event, the application of the customized tributary whiskers associated with the distribution ring take up valuable semiconductor board space.

The prior art of note fails to describe circuitry that provides acceptable and reliable synchronization of fanout buffer output signals. It is to be noted that prior attempts at output deskewing have been related to the use of relatively complex active transistor circuitry. Any reference to capacitive load sharing has been principally directed to that as a secondary feature of the active circuitry.

What is needed is a circuit that provides fanout synchronization. What is also needed is such circuitry that eliminates the hazards associated with DC shorts caused by linkage of all buffer outputs together. What is also needed is a fanout synchronization circuit that is relatively simple to form and that takes up a relatively small amount of board layout space.

SUMMARY OF THE INVENTION

It is an object of the present invention to provide a circuit that synchronizes fanout buffer output signals. It is also an object of the present invention to provide such circuitry without creating DC shorts or any other sort of output signal linking to the deleterious effects caused by vagaries associated with one or more of the buffer output nodes. Finally, it is an object of the present invention to provide fanout synchronization circuitry that is relatively simple to form and that takes up a relatively small amount of board layout space.

These and other objectives are achieved in the present invention through the introduction of sub-circuitry that is coupleable to existing fanout buffer output nodes of the type commonly used in the transmission, reception, and conversion of data, information, etc., moving from one location to another. The sub-circuitry of the present invention includes a capacitive element coupled to each output node of the fanout buffer. Each of those capacitive elements is linked together by way of a common bus. That common bus is preferably a floating bus in that it is not tied to any power pin, including either the high-potential power rail or the low-potential power rail of the system.

Using a floating bus as the common link ensures that DC shorts will not be developed across all buffer outputs. In addition, by not coupling the capacitive elements to the low-potential rail (ground) those elements will not act as a load on the buffer. A coupling to the power rails increases the problems associated with noise and jitter, including propagation and timing variations. Further, it is preferable to avoid additional output loading caused by coupling to the power rails in that it reduces the resultant power drain, increased heat, and reduced reliability associated therewith. This is of particular concern for low-power systems including, but not limited to, laptop computers for example.

The coupling of the capacitive elements, which may simply be capacitors or any other suitable charge regulator, to the common bus creates a homogenizing manifold. Specifically, faster individual output signals are slowed and slower signals are accelerated such that each output, at a point beyond its respective capacitive element, produces the same signal rate as all of the other buffer outputs. In effect, the faster signals act to charge through the common bus the capacitive elements of the nodes associated with slower signals.

The capacitive coupling arrangement of the present invention may be used to shape the buffer's output signals as a function of the capacitances selected for those elements. When board layout space is at a premium, the sizing of the capacitive elements may be adjusted accordingly. Nevertheless, such modifications will only result in an adjustment of the signal rate. Signal synchronization will remain across all outputs. Of course, the extent to which faster signals are slowed must be considered in each circumstance and so there may be some limitation on the capacitive adjustment of such signals.

The present invention is particularly suited for signals that are in phase. In that regard it has specific applicability in clock distribution circuitry, although those skilled in the art can readily see its usefulness in other systems requiring signal synchronization. It is to be noted that out-of-phase outputs may not be suited for synchronization using the coupled capacitive elements of the present invention.

It is to be understood that other objects and advantages of the present invention will be made apparent by the following description of the drawings according to the present invention.

DETAILED DESCRIPTION OF THE PREFERRED EMBODIMENT

Figure 1:
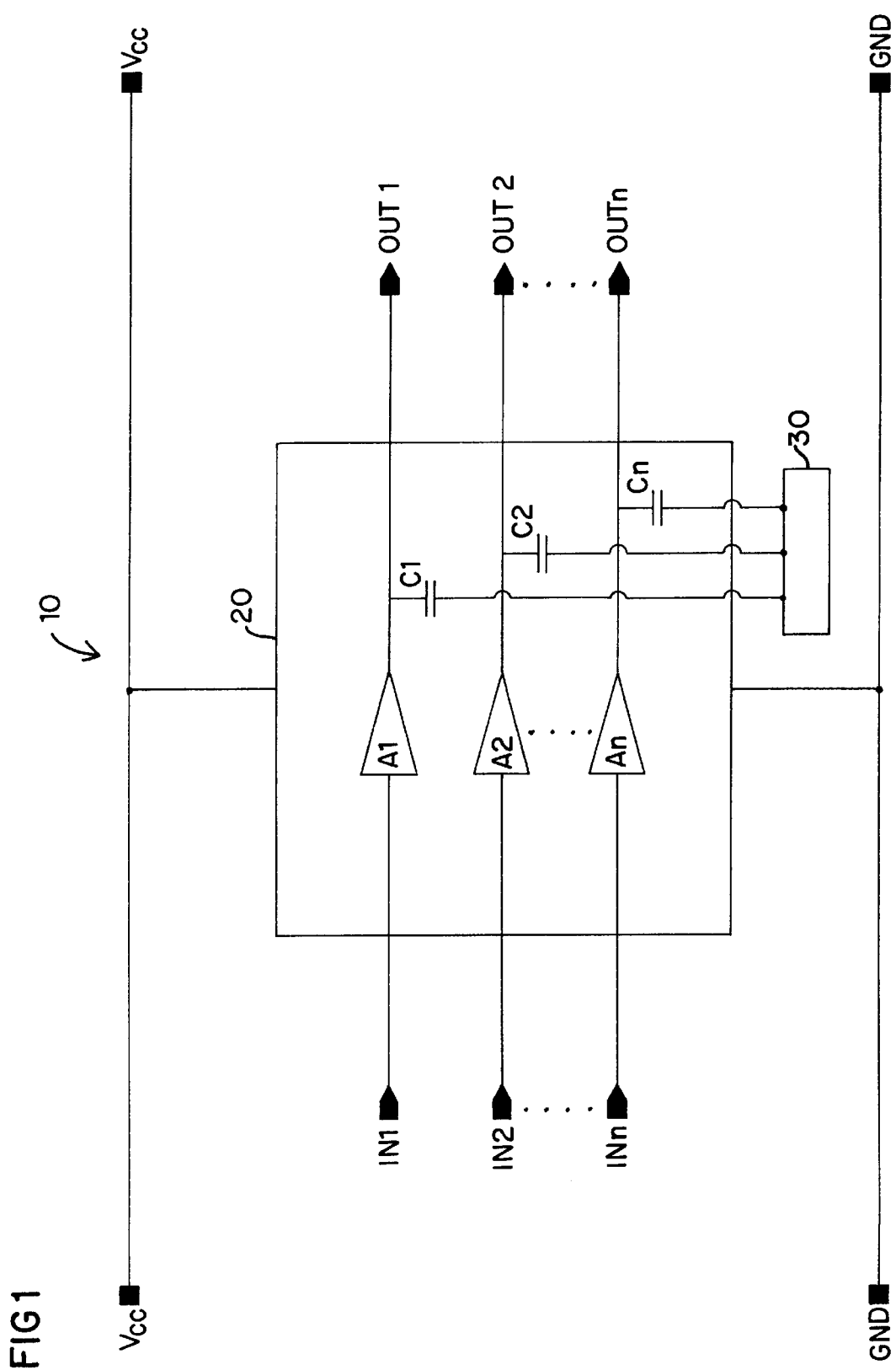
FIG. 1 is a simplified diagrammatic illustration of the output buffer signal synchronization circuit of the present invention.

As illustrated in FIG. 1, a synchronized fanout buffer circuit 10 of the present invention includes a prior-art buffer 20 having plurality of amplifiers exemplified by amplifiers A1, A2, and An. The buffer is powered by its connection between high-potential power rail Vcc and low-potential power rail GND. Each of the amplifiers has an input node coupled to a buffer input signal node and an output node coupled to a buffer output signal node. Each input node may be associated with a common external input signal system divided into a plurality of input signal nodes, or with a plurality of substantially synchronized input signal devices. In the circuit shown in FIG. 1 for illustrative purposes, first buffer input signal node IN1 is coupled to amplifier A1, second buffer input signal node IN2 is coupled to amplifier A2, and nth buffer input signal node INn is coupled to amplifier An. Similarly, first buffer output signal node OUT1 is coupled to amplifier A1, second buffer output signal node OUT2 is coupled to amplifier A2, and nth buffer output signal node OUTn is coupled to amplifier An. The designation "n" indicates any suitable number of 3 or more used to designate the total number of fanout nodes associated with the fanout buffer 20. It is to be noted that a single input may be used to generate the inputs to the amplifiers.

The key feature of the circuit 10 of the present invention is the addition to buffer 20 of a plurality of capacitive elements corresponding in number to the number of buffer output signal nodes identified in FIG. 1 as elements OUT1, OUT2, and OUTn. Specifically, each capacitive element has a node coupled to one of the buffer output signal nodes such that capacitive element C1 is coupled to OUT1, C2 is coupled to OUT2, and Cn is coupled to OUTn. Finally, the opposite node of each of the capacitive elements is coupled to a common bus 30.

The capacitive elements are preferably capacitors having a selectable capacitance. In general for many digital applications, that capacitance may be on the order of about 10 picofarads. Of course, it may be less or more for specific applications. The capacitive elements may be formed integral with the remainder of the buffer 20, or they may be formed external to that part of circuit 10. The common bus 30 is preferably formed of polysilicon or metal as part of most standard semiconductor fabrication processes. Alternatively, the device may be a stand-alone circuit that is coupled to one or more fanout buffers by external means, such as by standard leads. In that way, the device of the present invention can be used to homogenize the timing of otherwise independent buffer circuits such that propagation delays can be coordinated for otherwise independent and unrelated buffers. As indicated, the device thereby minimizes the effects of fabrication vagaries associated with disparate systems, as well as other vagaries affecting timing. It is to be noted that the common bus is to be isolated from high-potential rail Vcc and from low-potential rail GND in order to eliminate any DC couplings and to minimize loading of the buffer 20.

Figure 2:
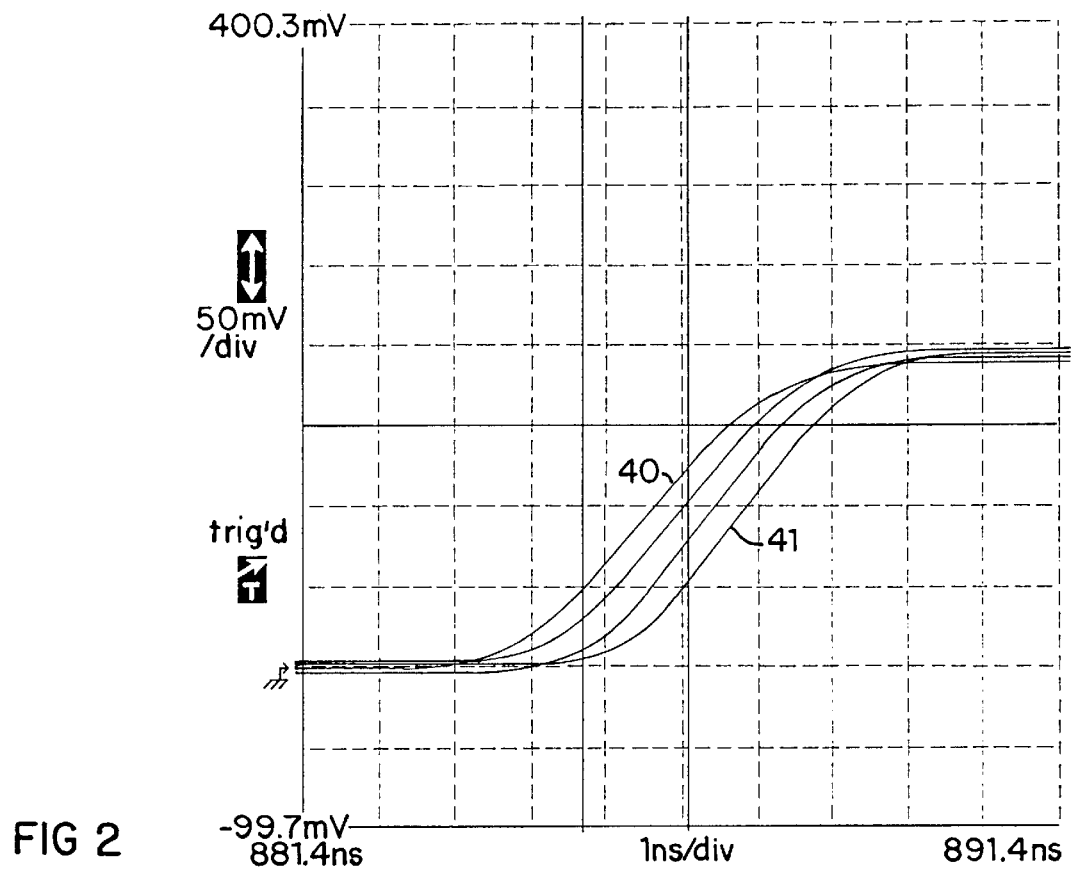
FIG. 2 is a set of waveforms illustrating the signals at the outputs of a prior-art fanout buffer for which four input signals were deliberately skewed such that the fastest signal is more than one nanosecond faster than the slowest signal.
Figure 3:
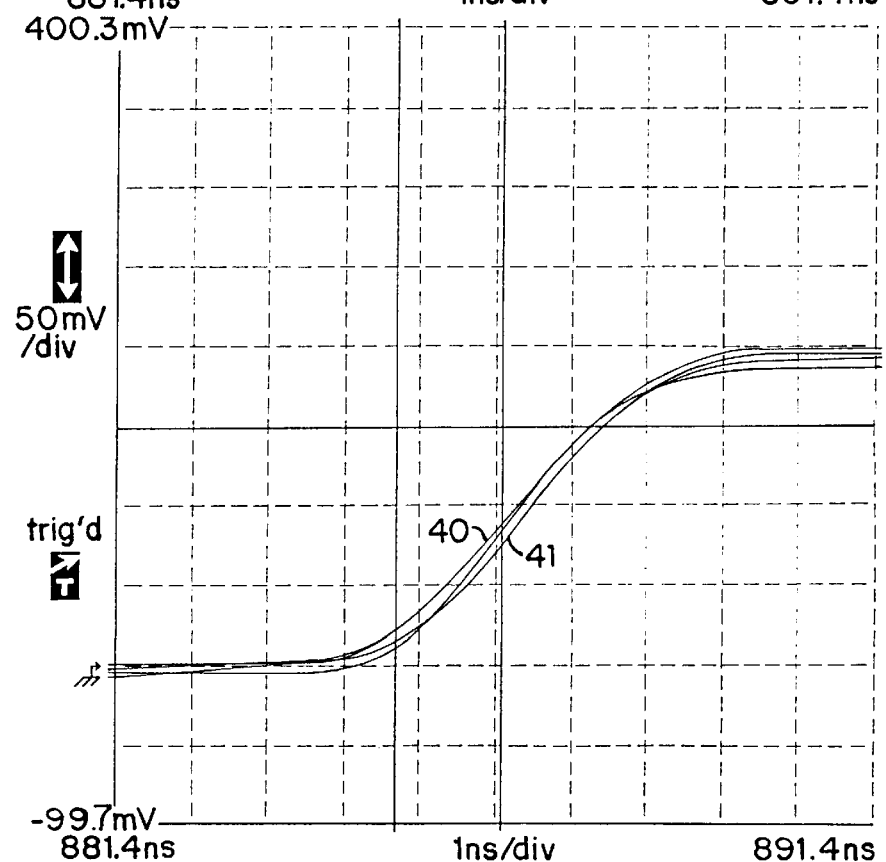
FIG. 3 is a set of waveforms illustrating the signals at the outputs of the same fanout buffer used in developing the waveforms shown in FIG. 2 but with the capacitive elements of the present invention coupled to each output and to a common bus.

The advantages associated with the use of the capacitive elements of circuit 10 can be seen with reference to the waveforms shown in FIGS. 2–7. In FIG. 2, four input signals of different transmission rates are seen as low-to-high-transition-signal outputs of a fanout buffer such as buffer 20 without the capacitive elements of the present invention. The fastest output signal, identified as wave 40, has a transmission rate that is slightly more than one nanosecond faster than the slowest signal, identified as wave 41. Addition of four capacitive elements, each being coupled to a respective one of the four fanout buffer output nodes associated with the waveforms of FIG. 2, and to a common bus such as designated bus 30, results in the waveforms shown in FIG. 3. It can be seen that all of the signals are transitioning at essentially the same rate, with a skew between wave 40 and wave 41 only about 0.2 nanoseconds.

Figure 4:
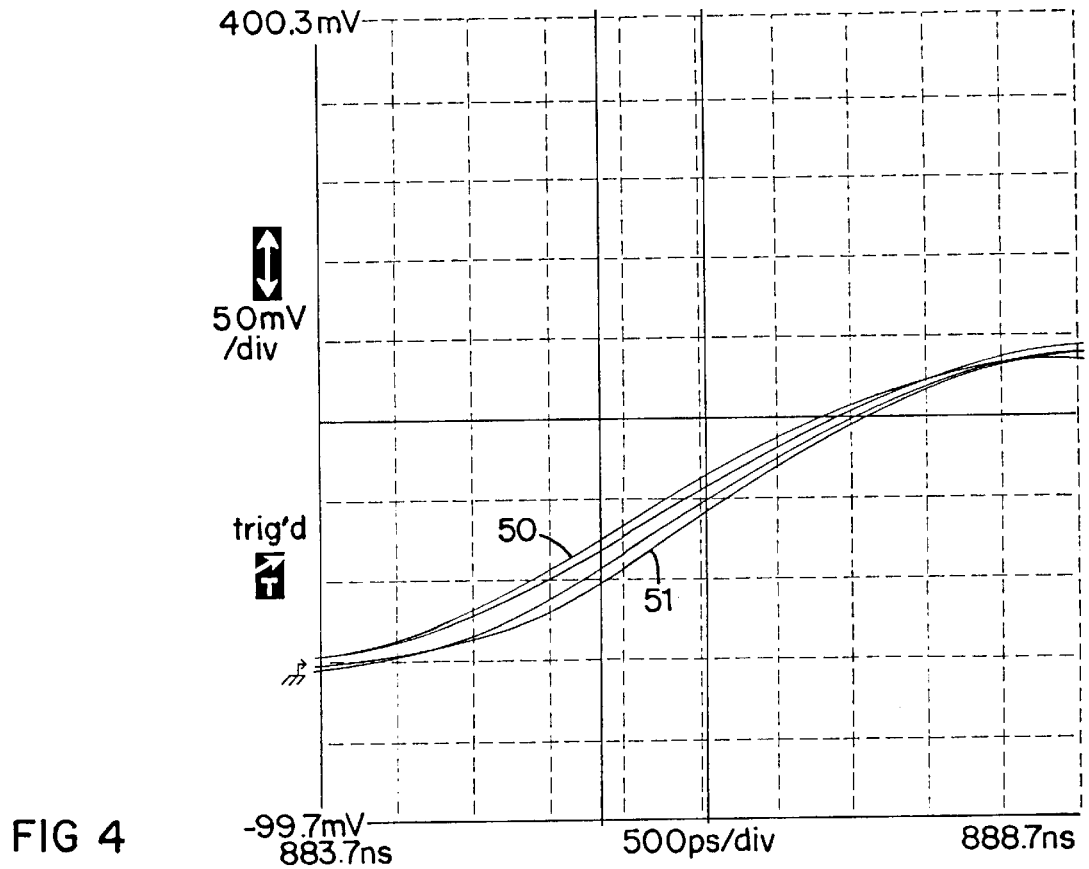
FIG. 4 is a set of waveforms illustrating the signals at the outputs of a prior-art fanout buffer for which four input signals were deliberately skewed such that the fastest signal is more than 500 picoseconds faster than the slowest signal.
Figure 5:
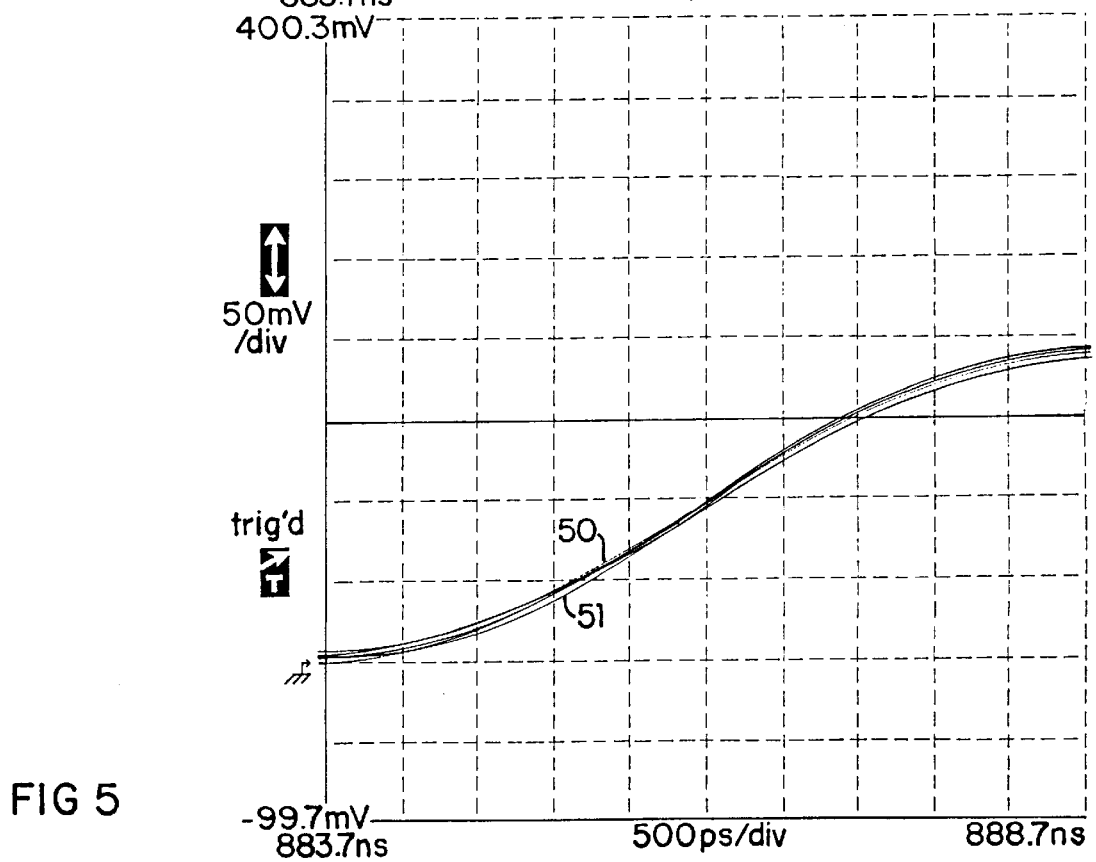
FIG. 5 is a set of waveforms illustrating the signals at the outputs of the same fanout buffer used in developing the waveforms shown in FIG. 4 but with the capacitive elements of the present invention coupled to each output and to a common bus.

Another comparison of the prior-art buffer outputs and the same buffer having the coupled capacitive elements is shown in FIGS. 4 and 5. In FIG. 4, four input signals of transmission rates that are different but less distinct than the rates associated with the signals of FIG. 2, are seen as low-to-high-transition-signal outputs of a fanout buffer such as buffer 20 without the capacitive elements of the present invention. The fastest output signal, identified as wave 50, has a transmission rate that is slightly more than 500 picoseconds faster than the slowest signal, identified as wave 51. Addition of four capacitive elements, each being coupled to a respective one of the four fanout buffer output nodes associated with the waveforms of FIG. 4, and to a common bus such as designated bus 30, results in the waveforms shown in FIG. 5. It can be seen that all of the signals are transitioning at essentially the same rate, with a skew between wave 50 and wave 51 that is negligible.

Figure 6:
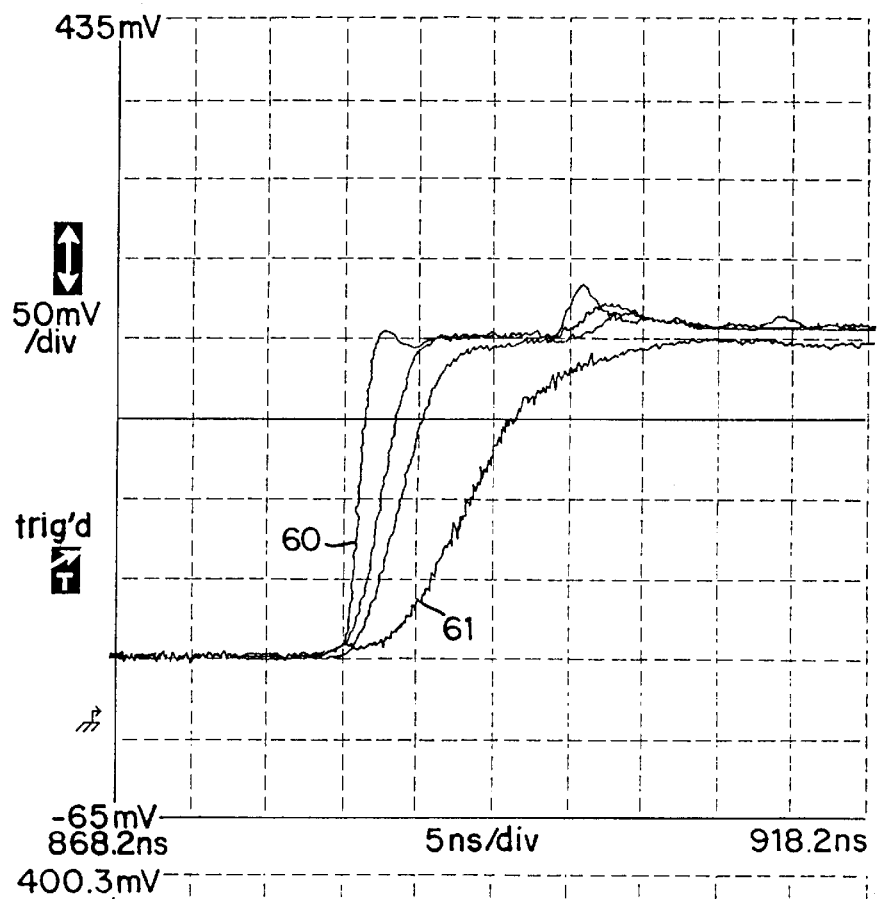
FIG. 6 is a set of waveforms illustrating the signals at the outputs of a prior-art fanout buffer for which four input signals were deliberately skewed with different transmission rates and different edge rates.
Figure 7:
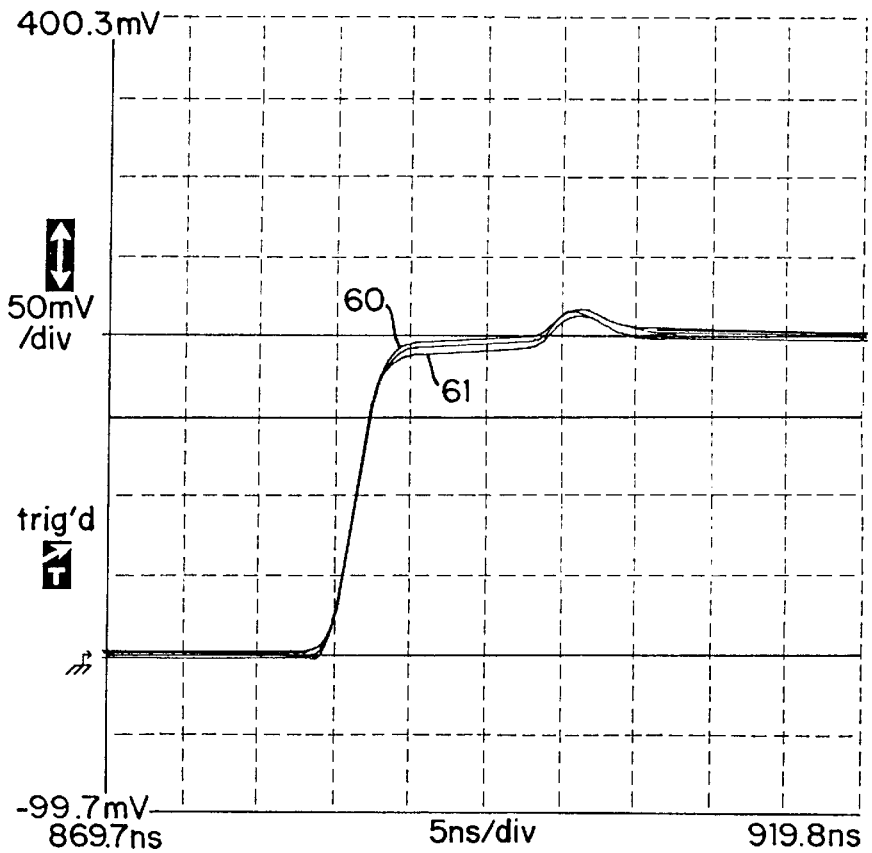
FIG. 7 is a set of waveforms illustrating the signals at the outputs of the same fanout buffer used in developing the waveforms shown in FIG. 6 but with the capacitive elements of the present invention coupled to each output and to a common bus.

A third indication of the advantage of applying the capacitive elements to the buffer's output nodes is shown with respect to FIGS. 6 and 7. In FIG. 6, four input signals of different transmission and transition edge rates are seen as low-to-high-transition-signal outputs of a fanout buffer such as buffer 20 without the capacitive elements of the present invention. The fastest output signal, identified as wave 60, has a transmission rate that is about 7.5 nanoseconds faster than the slowest signal, identified as wave 61. Addition of four capacitive elements, each being coupled to a respective one of the four fanout buffer output nodes associated with the waveforms of FIG. 6, and to a common bus such as designated bus 30, results in the waveforms shown in FIG. 7. It can be seen that all of the signals are transitioning at essentially the same rate, with a skew between wave 60 and wave 61 that is negligible. Moreover, the differing edge rates are substantially resolved using the common-bus-tied capacitive elements in the arrangement of the present invention as shown in FIG. 1.

The present invention is a circuit for deskewing multiple outputs from a fanout buffer. The circuit actively synchronizes varying output signal transition rates. It includes one capacitive element tied to each output node of the buffer. Each of the capacitive elements is tied to a common floating bus that is isolated from high-potential and low-potential power rails.

It should be understood that the preferred embodiment of the present invention as described herein is merely illustrative. Numerous variations and equivalents in design and use of the present invention may be contemplated in view of the following claims without straying from the intended scope and field of the invention disclosed.

I claim:

1. A deskew circuit for synchronizing output signals associated with a fanout buffer, wherein the fanout buffer includes at least one input node and a plurality of output nodes, the deskew circuit comprising for each output node a capacitive element having a first node coupled thereto, and wherein each capacitive element has a second node coupled to a common floating bus.

2. The deskew circuit as claimed in claim 1 wherein each said capacitive element is a capacitor.

3. The deskew circuit as claimed in claim 2 wherein each said capacitor has a capacitance of about 10 picofarads.

4. The deskew circuit as claimed in claim 1 wherein each said capacitive element is formed integrally with the buffer.

5. The deskew circuit as claimed in claim 1 wherein each said capacitive element is fabricated separately from the buffer.

6. The deskew circuit as claimed in claim 1 wherein said common floating bus is electrically isolated from the high-potential power rail and from the low-potential power rail.

7. The deskew circuit as claimed in claim 6 wherein said common floating bus is formed of polysilicon.

8. The deskew circuit as claimed in claim 6 wherein said common floating bus is formed of metal.

9. A deskew circuit for synchronizing output signals associated with a plurality of fanout buffers, wherein each of the plurality of fanout buffers includes at least one input node and a plurality of output nodes, the deskew circuit comprising for each output node of each of the plurality of fanout buffers a capacitive element having a first node coupled thereto, and wherein each capacitive element has a second node coupled to a common floating bus.

10. The deskew circuit as claimed in claim 9 wherein each said capacitive element is a capacitor.

11. The deskew circuit as claimed in claim 9 wherein each said capacitive element is formed integrally with one of the plurality of buffers.

12. The deskew circuit as claimed in claim 9 wherein each said capacitive element is fabricated separately from the plurality of buffers and is coupled independently thereto buffer.

13. The deskew circuit as claimed in claim 9 wherein said common floating bus is electrically isolated from the high-potential power rail and from the low-potential power rail.

14. The deskew circuit as claimed in claim 13 wherein said common floating bus is formed of polysilicon.

15. The deskew circuit as claimed in claim 13 wherein said common floating bus is formed of metal.

* * * * *